United States Patent
Majima et al.

(10) Patent No.: US 10,164,080 B2
(45) Date of Patent: Dec. 25, 2018

(54) ELECTRODE PAIR, METHOD FOR FABRICATING THE SAME, SUBSTRATE FOR DEVICE, AND DEVICE

(71) Applicant: JAPAN SCIENCE AND TECHNOLOGY AGENCY, Kawaguchi-shi, Saitama (JP)

(72) Inventors: Yutaka Majima, Yokohama (JP); Toshiharu Teranishi, Uji (JP); Shuhei Takeshita, Yokohama (JP)

(73) Assignee: JAPAN SCIENCE AND TECHNOLOGY AGENCY, Kawaguchi-shi, Saitama (JP)

(*) Notice: Subject to any disclaimer, the term of this patent is extended or adjusted under 35 U.S.C. 154(b) by 0 days.

(21) Appl. No.: 14/916,970

(22) PCT Filed: Mar. 9, 2014

(86) PCT No.: PCT/JP2014/056081
§ 371 (c)(1),
(2) Date: Mar. 4, 2016

(87) PCT Pub. No.: WO2015/033600
PCT Pub. Date: Mar. 12, 2015

(65) Prior Publication Data
US 2016/0197172 A1   Jul. 7, 2016

(30) Foreign Application Priority Data
Sep. 6, 2013   (JP) .................................. 2013-185650

(51) Int. Cl.
*H01L 29/76* (2006.01)
*H01L 31/09* (2006.01)
(Continued)

(52) U.S. Cl.
CPC .......... *H01L 29/7613* (2013.01); *B82Y 10/00* (2013.01); *H01L 21/445* (2013.01);
(Continued)

(58) Field of Classification Search
CPC ..... B82Y 10/00; B82Y 30/00; H01L 29/7613; H01L 29/0665; H01L 29/0649;
(Continued)

(56) References Cited

U.S. PATENT DOCUMENTS

| 6,791,338 B1 | 9/2004 | Bratkovski et al. |
| 2003/0040173 A1* | 2/2003 | Fonash ................ B01J 19/0093 438/622 |

(Continued)

FOREIGN PATENT DOCUMENTS

| JP | 2005-276892 A | 10/2005 |
| JP | 2008-192712 A | 8/2008 |

(Continued)

OTHER PUBLICATIONS

International Search Report dated Apr. 15, 2014, issued in counterpart Application No. PCT/JP2014/056081 (2 pages).
(Continued)

*Primary Examiner* — Bo Fan
(74) *Attorney, Agent, or Firm* — Westerman, Hattori, Daniels & Adrian

(57) ABSTRACT

Art electrode pair enables the performance of a device to be accurately delivered, a method for manufacturing the same. An electrode pair 10, wherein one electrode 12A and the other electrode 12B are provided on the same plane so as to face each other with a gap 17 therebetween, and portions of the one electrode 12A and the oilier electrode 12B facing each other are respectively curved so as to get away from the plane along a direction nearing each other. This electrode pair 10 is manufactured by preparing, as a sample, a sub-
(Continued)

strate on which a pair of seed electrodes is formed with a space therebetween so as to have an initial gap, immersing the sample in an electroless plating solution, changing the electroless plating solution after a lapse of a certain period of time, and adjusting the number of times of changing.

6 Claims, 11 Drawing Sheets

(51) Int. Cl.
  H01L 21/445  (2006.01)
  B82Y 10/00  (2011.01)
  H01L 29/417  (2006.01)
  H01L 29/12  (2006.01)
  H01L 29/06  (2006.01)
  B82Y 30/00  (2011.01)
(52) U.S. Cl.
  CPC ...... *H01L 29/0649* (2013.01); *H01L 29/0665* (2013.01); *H01L 29/127* (2013.01); *H01L 29/41725* (2013.01); *H01L 31/09* (2013.01); *B82Y 30/00* (2013.01)
(58) Field of Classification Search
  CPC ............. H01L 29/127; H01L 29/41725; H01L 21/445; H01L 31/09
  USPC .................. 438/765, 622; 257/773, 9, 24
  See application file for complete search history.

(56) References Cited

U.S. PATENT DOCUMENTS

| | | | | |
|---|---|---|---|---|
| 2003/0162587 | A1* | 8/2003 | Tanamoto ............... | B82Y 10/00 463/22 |
| 2004/0002195 | A1* | 1/2004 | Brousseau, III ....... | B82Y 10/00 438/301 |
| 2006/0134442 | A1* | 6/2006 | Sugiyama ........... | C23C 18/2066 428/457 |
| 2006/0225994 | A1* | 10/2006 | Onishi ................ | C23C 18/1648 200/181 |
| 2008/0108227 | A1* | 5/2008 | Kumagai ............... | B82Y 10/00 438/765 |
| 2009/0130427 | A1* | 5/2009 | Grigoropoulos ......... | B41M 5/42 428/323 |
| 2010/0308328 | A1* | 12/2010 | Makihara ............... | B82Y 10/00 257/48 |
| 2011/0123813 | A1* | 5/2011 | Yae ..................... | C23C 18/1651 428/450 |
| 2011/0127431 | A1 | 6/2011 | Paek | |
| 2014/0054788 | A1* | 2/2014 | Majima ................. | B82Y 10/00 257/773 |

FOREIGN PATENT DOCUMENTS

| | | |
|---|---|---|
| JP | 2011-119642 A | 6/2011 |
| JP | 2011-176211 A | 9/2011 |
| JP | 2012-47595 A | 3/2012 |
| JP | WO2012/121067 A1 | 9/2012 |
| JP | 2013-62658 A | 4/2013 |
| WO | 2012/121067 A1 | 9/2012 |

OTHER PUBLICATIONS

Kano et al., "Random telegraph signals by alkanethiol-protected Au nanoparticles in chemically assembled single-electron transistors", Journal of Applied Physics, 2013, 114, 223717 (7 pages).
Hackenberger et al., "Silicon-Nitride-Passivated Bottom-Up Single-Electron Transistors", Japanese Journal of Applied Physics, 2013, 52, 110101 (5 pages).
Majima et al., "Negative Differential Resistance by Molecular Resonant Tunneling between Neutral Tribenzosubporphine Anchored to a Au(111) Surface and Tribenzosubporphine Cation Adsorbed on to a Tungsten Tip", Jaurnal of The American Chemical Society, 2013, 135, pp. 14159-14166 (8 pages).
Valladares et al., "Reorientation Response of Magnetic Microspheres Attached to Gold Electrodes Under an Applied Magnetic Field" Brazilian Journal of Physics, vol. 43, No. 4, (7 pages).
Choi et al., "Fabrication and Characterization of Fully Flattened Carbon Nanotubes: A New Graphene Nanoribbon Analogue" Scientific Reports, 2013, 3, 1617 (5 pages).
Majima, "Bottom-up Single-Electron Transistors and Molecular Devices", Intenational Conference on Flexible and Printed Electronics, Close-up, 2013, vol. 28, No. 5, pp. 42-45 (4 pages).
Majima, Electroless Plated Nanogap Electrodes and Their Device Applications, 26th International Micro Processes and Nanotechnology Conference, 2013, Japan (6 pages).
Majima, "Bottom-up Single-Electron Transistors and Molecular Devices", International Conference on Flexible and Printed Electronics, 2013, Korea, Sep. 10-13, 2013 (4 pages).
Bao et al., "Room-Temperature Single Molecular Memory", The 24th International Conference on Molecular Electronics and Devices, Call for Papers IC ME&D, May 15-16, 2013, Korea (7 pages).
Kobayashi et al., "251—Multlstate switching of redox active unimolecular device based on electroless plated gold nanogap electrodes", Ramanathan Nagarajan, KJF International Conference on Organic Materials for Electronics and Photonics, Mar. 16, 2014, USA (3 pages).
"Cyano-Anchored Triptycene Self-assembled Mololayer on Au (111) Surface", KJF International Conference on Organic Materials for Electronics and Photonics, Aug. 28-31, 2013, Korea (3 pages).
"Memory Operation in Electroless Gold Plated Nanogap Electrodes", KJF International Conference on Organic Materials for Electronics and Photonics, Aug. 28-31, 2013, Korea (3 pages).
"Surface Potential of Hyper-branched Polystyrene Protected Au Nanoparticles Measured by Kelvin Force Microscopy", KJF International Conference on Organic Materials for Electronics and Photonics, Aug. 28-31, 2013, Korea (4 pages).
"Inverter and 2-bit Analog-to-Degital Converter Operation by Chemically Assembled Single-Electron Transistors", KJF International Conference on Organic Materials for Electronics and Photonics, Aug. 28-31, 2013, Korea (3 pages).
"Electroless Gold Plating Processes for Fabrication of Uniform Nanogap Electrodes for Large Chip Areas", KJF International Conference on Organic Materials for Electronics and Photonics, Aug. 28-31, 2013, Korea (3 pages).
Serdio et al., "Electroless Gold Plating Processes for the Fabrication of Nanogap Electrodes" Seventh International Conference on Science and Technology of Advanced Ceramics, Jun. 19-21, 2013, Japan (5 pages).
Azuma et al., "Molecular Devices Consisting of [6,6]-Phenyl-C61-Butyric Acid Methyl Ester and Electoless Plated Au Nanogap Electrodes" Seventh International Conference on Science and Technology of Advanced Ceramics, Jun. 19-21, 2013, Japan (5 pages).
Serdio et al., "Self-terminated Nanogap Electrodes by Electroless Gold Plating", Extended Abstracts of The 61st Spring Meeting, 2014, Japan (3 pages).
Kawamoto et al., "Tunneling Resistance of Porphyrin Ligand Protected Au Nanoparticle", Extended Abstracts of The 61st Spring Meeting, 2014, Japan (3 pages).
Onuma et al., "Vertical Asymmetric Nanogap Electrodes Fabricated by Electroless Gold Plating (EGP)", Extended Abstracts of The 61st Spring Meeting, 2014, Japan (3 pages).
Aoyama et al., "Relationship between Density of Nanogap Electrodes and Growth Velocity of Electro less Gold Plating", Extended Abstracts of The 61st Spring Meeting, 2014, Japan (3 pages).
Majima et al., "Electroless Plated Nanogap Electrodes and Their Device Applications", Tokyo Institute of Technology, Nov. 2013, Japan (2 pages).
Kawamoto et al., "3 CN Anchored Triptycene SAM on Au(III)", The 60th JSAP Spring Meeting, 2013, Japan (3 pages).

(56) References Cited

OTHER PUBLICATIONS

Azuma et al., "Inelastic tunneling phenomena of [6,6]-Phenyl-C61-Butyric Acid Methyl Ester Introduced in Au Nanogap Electrode", The 60th JSAP Spring Meeting, 2013, Japan (3 pages).

Hurtado S. et al., "Room Temperature Memory Operation in a Solid-State Device based on Thiol-Functionalized Oligo(Phenylene-Ethynylene)-Protected Gold Nanoparticles", The 60th JSAP Spring Meeting, 2013, Japan (3 pages).

Kano. et al., "Stochastic Switching of Thiol-Functionalized Oligo(Phenylene-Ethynylcnc)-Protected Au Nanoparticles", The 60th JSAP Spring Meeting, 2013, Japan (3 pages).

Aoyama. et al., "2-bit Analog-to-Digital Converter by Chemically Assembled Single-Electron Transistors", The 60th JSAP Spring Meeting, 2013, Japan (3 pages).

Hackenberger et al., "Aluminum Oxide Passivated Chemically Assembled Single-Electron Transistors", The 60th JSAP Spring Meeting, 2013, Japan (3 pages).

Yakeshita et al., "Cross-sectional Observation ofNanogap Electrodes Fabricated by Molecular Ruler Electroless Gold Plating (MoREP)", The 60th JSAP Spring Meeting, 2013, Japan (3 pages).

Serdio et al., "Electro less Gold Plating Processes for the Fabrication of Nanogap Electrodes", The 60th JSAP Spring Meeting, 2013, Japan (3 pages).

Azuma et al., "Surface Potential of Hyper-branched Polystyrene Protected Au Nanoparticles Observed by Kelvin Force Microscopy", Extended Abstracts of the 74th JSAP Spring Meeting, 2013, Japan (3 pages).

Kano et al., "Room-Temperature Coulomb Blockade from Chemically Synthesized Au Nanoparticles Stabilized by Acid-Base Interaction", Applied Physics Express 3, 2010, Japan (4 pages).

Maeda et al., "Logic Operations of Chemically Assembled Single-Electron Transistor", ACS Nano, 2012, vol. 6, No. 3, pp. 2798-2803, (6 pages).

Okabayashi et al., "Uniform charging energy of single-electron transistors by using sizecontrolled Au nanoparticles", Applied Physics Letters, 100, 033101, 2012 (4 pages).

Serdio et al., "Robust nanogap electrodes by self-terminating electroless gold plating", The Royal Society of Chemistry, Nanoscale, 2012, 4, pp. 7161-7167, (7 pages).

Inokawa et al., "A Multiple-Valued Logic and Memory with Merged Single-Electron and MOS Transistors", The Institute of Electronics, Information and Communication Engineers, 2012, pp. 15-20, w/English abstract (6 pages).

Yasutake et al., "Simultaneous fabrication of nanogap gold electrodes by electroless gold plating using a common medical liquid", Applied Physics Letters 91, 203107, 2007 ( 3 pages).

Serdio V., Victor M., et al., "Robust Nanogap Electrodes by Self-Terminating Electrodes Gold Plating", Nanoscale, vol. 4, No. 22, Jan. 1, 2012, pp. 7161-7167. Cited in the Extended (supplementary) European Search Report dated May 10, 2017.

Extended (supplementary) European Search Report dated May 10, 2017, issued in counterpart European Patent Application No. 14842611.7. (9 pages).

* cited by examiner (A)

(B)

ELECTRODE PAIR, METHOD FOR FABRICATING THE SAME, SUBSTRATE FOR DEVICE, AND DEVICE

TECHNICAL FIELD

The present invention relates to an electrode pair having a gap, a method for fabricating the same, a substrate for a device, and a device.

BACKGROUND ART

A device configured by making an electrode pair facing each other so as to have a nanogap therebetween and by placing a nanoparticle or molecule in the nanogap has a switching and memory functions, and is thus considered promising as a new device. The inventors aim to assemble a single electron transistor (SET) by introducing a chemically synthesized metal nanoparticle into nanogap electrodes produced by electroless gold plating, thus making an SET integrated circuit that operates at room temperatures (Non-patent Literature 1). The inventors have also succeeded in producing nanogap electrodes having a gap length of 5 nm or shorter at an yield of 90% (Non-patent Literature 2), and furthermore developed a "molecular ruler electroless gold plating (MoRELGP)" method using a surfactant agent molecule as a template, thus establishing a technology for producing nanogap electrodes having a gap length of 2 nm with high reproducibility (Patent Literature 1).

CITATION LIST

Patent Literature

Patent literature 1: WO2012/121067

Non-Patent Literature

Non-patent Literature 1: K. Maeda, Y. Majima et al. ACS Nano, 6, 2798 (2012)
Non-patent Literature 2: Victor M. Serdio V., Yasuo Azuma Shuhei Takeshita, Tare Muraki, Toshiharu Teranishi and Yutaka Majima, Nanoscale, 4, 7161 (2012)

SUMMARY OF INVENTION

Technical Problem

However, details of the structure of the nanogap electrodes produced by the technology disclosed in Patent Literature 1, details of the cross-sectional structure in particular, are unknown, which has inhibited fabrication of devices using nanogap electrodes. The reason is that the cross-sectional structure controls the quantity of functional materials introduced between nanogap electrodes such as nanoparticles or molecules, determining the capacitance, namely gate capacitance, between the gate electrodes and the functional materials. It is also desired to fabricate an electrode pair, in addition to nanogap electrodes, by adjusting facing areas while maintaining smooth surfaces and a gap therebetween because the performance of a device is determined by such an adjustment.

In view of the problem, an object of the present invention is to provide an electrode pair that enables a device to deliver its performance accurately, a method for fabricating the electrode pair, a substrate for a device having the electrode pair, and a device.

Solution to Problem

In order to achieve an object, the following means are taken in the present.

[1] An electrode pair, comprising:
one electrode and the other electrode provided on a same plane, facing each other with a gap therebetween,
wherein portions of the one electrode and the other electrode facing each other are curved in a manner getting away from the plane along a direction nearing each other.

[2] The electrode pair as set forth in [1],
the one electrode and the other electrode respectively comprising: a main body portion extending in one direction; and a proximity portion extending from the main body portion in a manner where each tip is adjacent to and facing each other,
wherein the main body portion contacts the plane, whereas the proximity portion does not contact the plane but is curved in a manner getting away from the plane along a direction nearing the tip.

[3] The electrode pair as set forth in [2],
wherein the proximity portion has a curved convex outer surface, cross sectional area of the proximity portion orthogonal to an axis that extends from the main body portion toward the tip becoming smaller along a direction nearing the tip.

[4] The electrode pair as set forth in [2],
wherein the one electrode and the other electrode respectively comprise: a metal layer; and an adhesive layer provided between the metal layer and the plane in order to tightly adhere the metal layer to the plane, and
the proximity portion is comprised of the metal layer.

[5] A substrate for a device, comprising:
a substrate; an electrode pair provided on the substrate, one electrode and the other electrode having a gap therebetween; and an insulating layer provided to cover the electrode pair,
wherein space is formed by the one electrode, the other electrode, the substrate, and the insulating layer.

[6] A device, comprising: the electrode pair as set forth in any one of [1] to [4] having nanogap therebetween,
wherein, the one electrode and the other electrode are respectively used as a source electrode and a drain electrode, and
a nanoparticle or a functional molecule is provided in the nanogap.

[7] A device, comprising: the electrode pair as set forth in any one of [1] to [4] as a photoconductive antenna electrode pair.

[8] A method for fabricating an electrode pair, comprising: preparing a substrate as a sample, the substrate on which a pair of seed electrodes is formed with apace, the space being an initial gap;
immersing the sample in an electroless planting solution;
exchanging the electroless planting solution after a predetermined time elapses.

[9] The method for fabricating an electrode pair as set forth in [8], further comprising: adjusting the number of times of changing the electroless plating solution so that surfaces facing each other are extended in a longitudinal direction while a gap between one electrode and the other electrode is kept constant.

Effects of Invention

According to the present invention, one electrode and the other electrode are placed on the same plane, facing each other, and opposed portions of the one electrode and the other electrode are curved in a manner getting away from that plane along a direction nearing each other. It is therefore possible to fabricate a strong electric field in the gap by applying a small voltage between the electrodes. Hence, the performance of each device can be worked efficiently by placing a nanoparticle or molecule in the gap to create a device, or by using an electrode pair as a photoconductive antenna. Furthermore, according to the present invention, a substrate on which a seed electrode pair is formed so as to have an initial gap therebetween is prepared as a sample, and an electroless plating solution in which the sample is immersed is replaced when a predetermined period of time has elapsed. An electrode pair having smooth surfaces can thus be fabricated by adjusting the facing areas while maintaining the gap.

Figure 1:
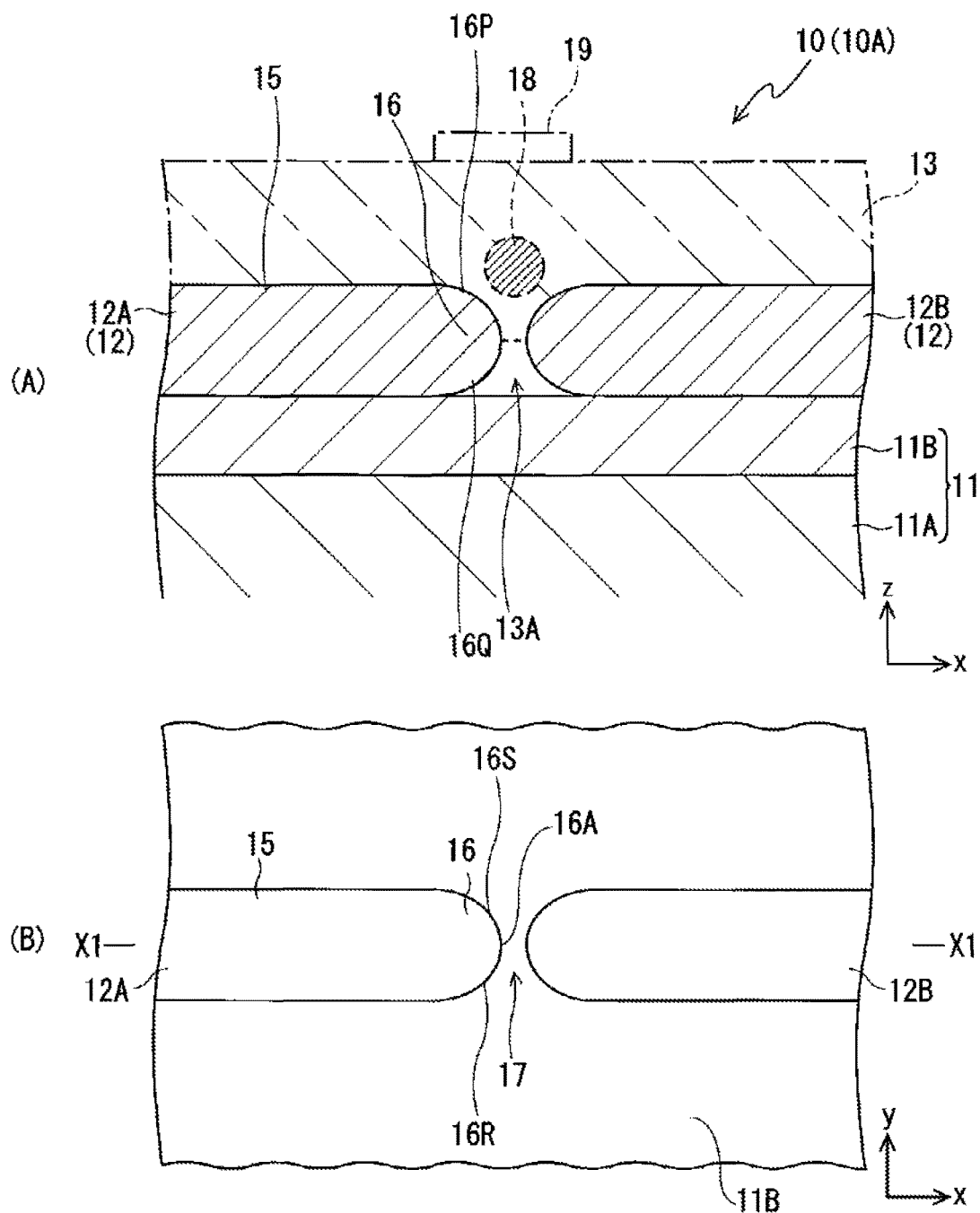
FIG. 1 shows an electrode pair according to a first embodiment of the present invention, where (A) is a cross-sectional view taken along line X1-X1 in (B), and (B) is a plan view.

REFERENCE SIGNS LIST 10, 20, 50: Electrode pair
10A, 20A: Device
11: Substrate
11A: Semiconductor substrate
11B: Insulating layer (first insulating layer)
12: Electrode
12A: One electrode
12B: The other electrode
12C, 12D, 12X, 12Y: Metal layer
12E, 12F: Seed electrode
13: Insulating layer (second insulating layer)
13A: Space
14A, 14B, 14C, 14D: Adhesive layer
15: Main body portion
16: Proximity portion
16A: Tip
16B: Opposed surface
16P: Top part
16Q: Bottom part
16R: Front part
16S: Rear part
17: Gap
18: Metal nanoparticle (functional molecule)
19: Top gate
21, 22: Protective layer
30: System for generating THz electromagnetic wave
31: Photoconductive antenna element
32: Coplanar transmission line
33: Antenna
33A: One electrode
33B: The other electrode
34: Substrate (GaAs substrate)
35: Hemispherical lens Description of Embodiments The embodiments of the present invention will hereinafter be described by referring to the drawings. The embodiments of the present invention can be modified in various ways for use within the range of the invention indicated in the scope of the patent claims.

[An electrode pair and a substrate for a device having the electrode pair]

FIG. 1 shows an electrode pair according to a first embodiment of the present invention, where (A) is a cross-sectional view taken along line X1-X1 in (B), and (B) is a plan view. The electrode pair 10 according to the embodiment of the present invention is structured by placing one electrode 12A and the other electrode 12B on the same plane so as to face each other via a gap 17. The opposed portions of the one electrode and the other electrode are curved in a manner getting away from that plane along a direction nearing each other. The following description assumes that that plane is the surface of a substrate 11.

As shown in FIG. 1, the electrode pair 10 is made of one electrode 12A and the other electrode 12B provided so as to face each other with a nanogap therebetween on a substrate 11, which is configured by providing an insulating layer 11B on a semiconductor substrate 11A.

As shown in FIG. 1, the one electrode 12A and the other electrode 12B have a main body portion 15 extending in one direction, and a proximity portion 16 extending from the main body portion 15 in a manner where each tip 16A is adjacent to and facing each other. Each proximity portion 16 extends from the main body portion 15 in an axial direction in a plan view toward the opposing electrode 12 (hereinafter simply represented as the electrode 12 when the one electrode is not distinguished from the other), tips 16A make a gap 17. The gap 17 is set according to devices. The distance between the tip 16A of the one electrode 12A and the tip 16A of the other electrode 12B may be several micrometers, or several nanometers, 0.3 nm to 12 nm, for example. As shown in FIGS. 1(A) and (B), one direction is defined as x direction, the width direction of the electrode 12 is defined as y direction, and the thickness direction of the electrode 12 is defined as z direction. The tip 16A of the one electrode 12A and the tip 16A, of the other electrode 12B face each other with a gap 17 therebetween. The length of the gap 17 in the y direction is determined by electroless plating solution and plating conditions. The length may be 0.3 nm or longer or approximately 90% of the width of the main body portion 15 in the y direction.

In a first embodiment of the present invention, the main body portions 15 contact an insulating layer 11B, the proximity portions 16 do not contact the insulating layer 11B, and the proximity portions 16 are curved in a manner getting away from the insulating layer 11B along a direction nearing tips 16A. The proximity portion 16 has a convex outer surface, whose cross section orthogonal to the axis that extends from the main body portion 15 toward the tip 16A becoming smaller along a direction nearing the tip 16A. Specifically, the cross-sectional area orthogonal to the axial direction (x direction) of the main body portion 15 becomes smaller along a direction nearing the tip 16A, and the tip 16A has the smallest cross-sectional area, namely the smallest dimension. Unlike the main body portion 15, the proximity portion 16 makes a state of vacancy immediately below just as an eaves, forming space 13A. The state of the proximity portion 18 forming such space is called an "eaves structure."

It is desirable that the proximity portions 16 be nearly symmetrical vertically with respect to a surface mostly in the middle of the electrode 12 in the thickness direction (z direction), as shown in FIG. 1(A). It is particularly preferable that top portion 16P and bottom portion 16Q of the cross-sectional shape orthogonal to the substrate 11 containing the axis (X1-X1) of extension of the main body portion 15 of the electrode 12, are curved, forming a part of a secondary curve such as nearly arc or elliptical arc. It is also desirable that the proximity portions 16 be nearly symmetrical with respect to a surface mostly in the middle of the electrode 12 in the width direction (y direction). In particular, front portion 16R and rear portion 16S of the cross-sectional shape orthogonal to the substrate 11 containing the line of the electrode 12 in the width direction, are respectively curved, forming a part of a secondary curve such as nearly arc or elliptical arc. In the structure of the proximity portions 16, the center of curvature of the top portion 16P and that of the bottom portion 16Q, of the cross-sectional shape orthogonal to the substrate 11 containing the axis of extension of the main body portion 15 of the electrode 12, and the center of curvature of the front portion 16R and that of the rear portion 16S, of the cross-sectional shape orthogonal to the substrate 11 containing the line of the electrode 12 in the width direction, all exist within the proximity portion 16.

Figure 2:
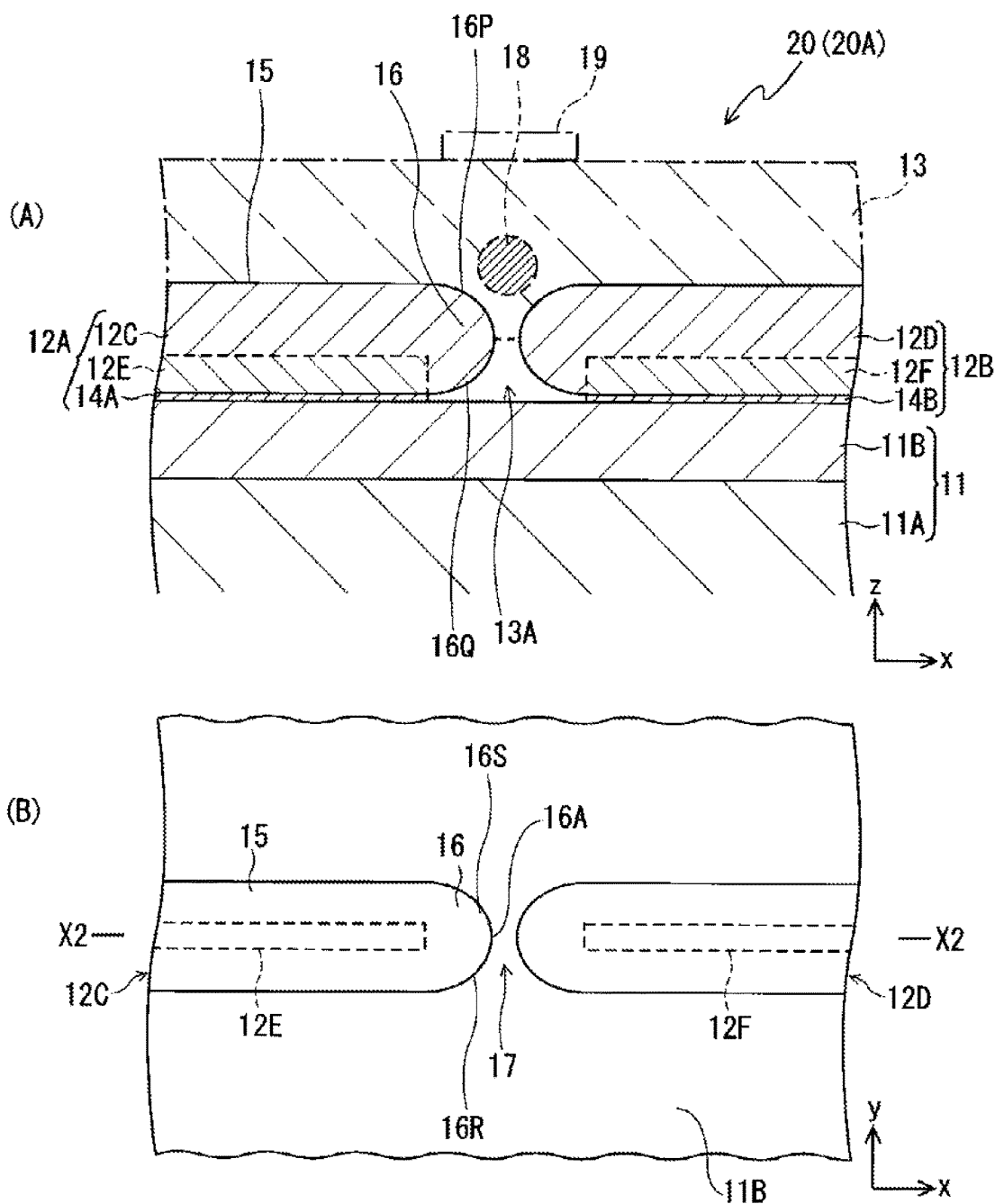
FIG. 2 shows an electrode pair according to a second embodiment of the present invention, where (A) is a cross-sectional view along the line X2-X2 in (B), and (B) is a plan view.

FIG. 2 shows an electrode pair according to a second embodiment of the present invention, where (A) is a cross-sectional view along the line X2-X2 in (B), and (B) is a plan view. The same signs are allocated to portions identical to or corresponding to the portions of the electrode pair shown in FIG. 1. The second embodiment is different in that a pair of adhesive layers 14A, 14B is provided on the insulating layer 11B to have a gap therebetween, and that a metal layer 12C, 12D is provided to each of the pair of adhesive layers 14A, 14B.

In the second embodiment, one electrode 12A is made of an adhesive layer 14A and a metal layer 12C, while the other electrode 12B is made of an adhesive layer 14B and a metal layer 12D. As shown in FIG. 2, each proximity portion 16 is made only of a portion of the metal layer 12C, 12D that does not contact the adhesive layer 14A, 14B. Consequently, similar to the first embodiment, the proximity portions 16 do not contact the insulating layer 11B, and are curved in a manner getting away from the insulating layer 11B along a direction nearing the tip. The proximity portions 16 have a convex outer surface whose cross section orthogonal to the axis extending from the main body portion 15 toward the tip 16A becomes smaller along a direction nearing the tip 16A. In other words, the cross section orthogonal to the axial direction of the main body portion 15 (x direction) becomes smaller toward the tip 16A, whose area is the smallest.

In the second embodiment, since the metal layers 12C, 12D are formed on the insulating layer 11B via the adhesive layers 14A, 14B, the metal layers 12C, 12D can be hardly peeled off from the insulating layer 11B.

Figure 3:
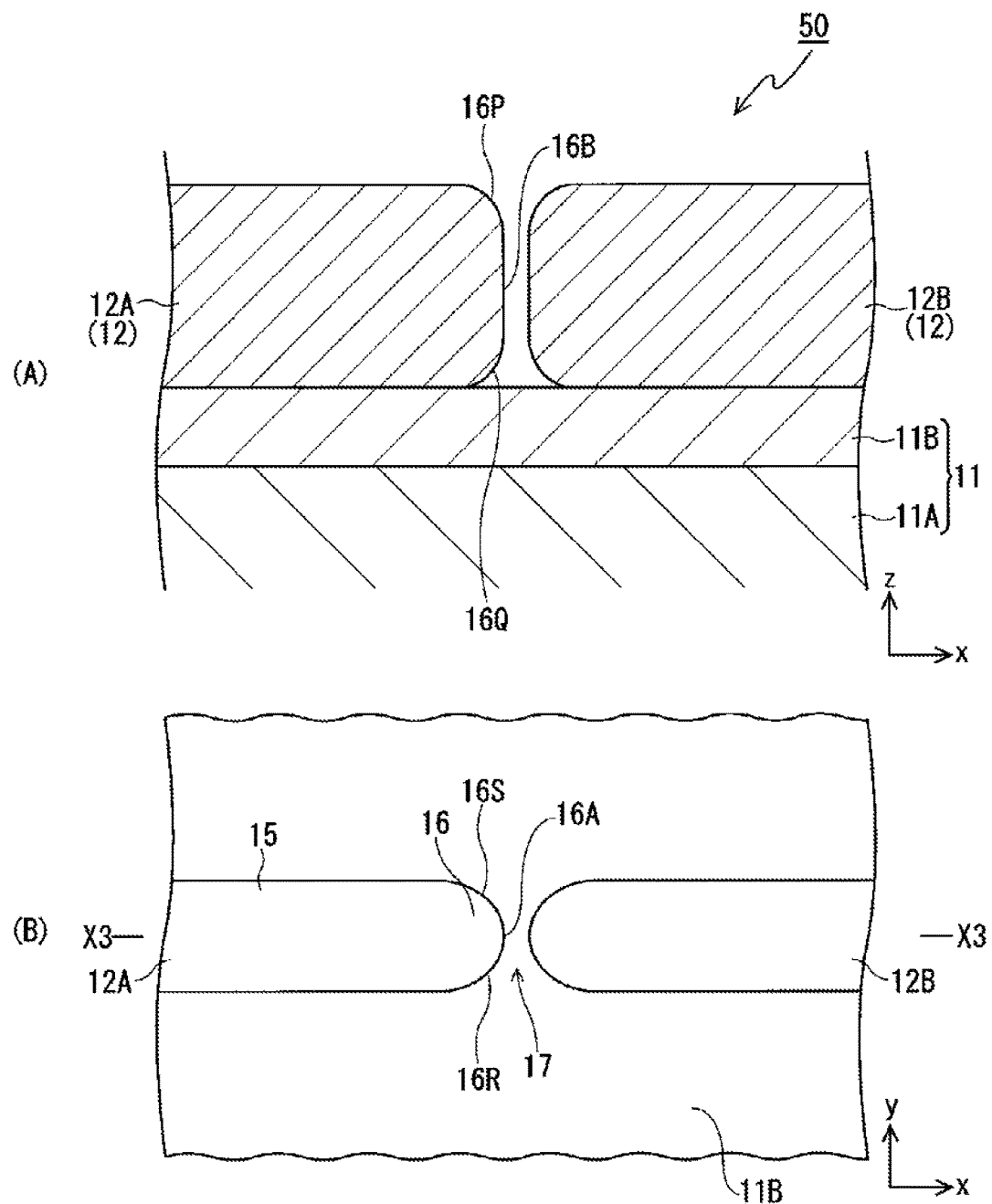
FIG. 3 shows an electrode pair according to a third embodiment of the present invention, where (A) is a cross-sectional view taken along line X3-X3 in (B), and (B) is a plan view.

FIG. 3 shows an electrode pair 50 according to a third embodiment of the present invention, where (A) is a cross-sectional view taken along line X3-X3 in (B), and (B) is a plan view. The same signs are allocated to the portions identical to or corresponding to those in the electrode pair shown in FIG. 1. The third embodiment is different from the first embodiment in that an opposed surface 16B of the one electrode 12A and that of the other electrode 12B face each other while maintaining a gap within a predetermined range, and that the opposed surfaces 16B have a predetermined area. The predetermined area falls within a range from 20 $nm^2$ to 560 $nm^2$ for example, assuming that the width of the electrodes falls within a range from 10 nm to 80 nm and that the height of the electrodes falls within a range from 2 nm to 70 nm. The one electrode 12A and the other electrode 12B have a thickness, namely height, larger than that in the first and the second embodiments. In the third embodiment also, the main body portion 15 contacts the insulating layer 11, the proximity portions 16 do not contact the insulating layer 11B, and the proximity portions 16 are curved in a manner getting away from the insulating layer 11B along a direction nearing the tip 16A. Furthermore, the proximity portions 16 have a convex outer surface whose cross section orthogonal to the axis extending from the main body portion 15 toward the tip 16A becomes smaller along a direction nearing the tip 16A. In other words, the cross-sectional area orthogonal to the axial direction (x direction) of the main body portion 15 becomes smaller along a direction nearing the tip 16A, and the tip 16A has the smallest cross-sectional area. In the third embodiment, the area at the end of the tip 16A rarely changes in the top-bottom direction, the area has a fixed size.

The one electrode 12A and the other electrode 12B are placed facing each other, and the size of the gap 17 falls within a fixed range on the order of nanometer for example. That is why the size of opposed surfaces 16B and that of the gap can be designed flexibly, ensuring a very large capacitance even with nano-size electrodes, which is an advantage. It is desirable in the third embodiment also that adhesive layers 14A, 14B be provided as shown in FIG. 2.

In the first to the third embodiments, various semiconductor substrates such as Si and GaAs substrates are used as a semiconductor substrate 11A. The insulating layer 11B is formed by various insulating materials such as $SiO_2$ and $Si_3N_4$. The one electrode 12A and the other electrode 12B in the first embodiment and the metal layers 12C, 12D in the second embodiment can be formed by metals such as Au, Al, Ag, Cu, and Ni. The adhesive layers 14A, 14B in the second embodiment can be formed by Ti, Cr, Ni, etc. The metal layers 12C, 12D can be formed on the adhesive layers 14A, 14B by the same metal or different metals such as Au, Al, Ag, Cu, and Ni.

A device 10A, 20A using the above-mentioned electrode pair 10, 20 will be described. Since the gap 17 here is set so as to have a nano size, the gap 17 is called "nanogap," and such an electrode pair is called "nanogap electrodes." As shown by the dotted line in FIGS. 1 and 2, a metal nanoparticle or functionalized molecule ("functionalized molecule" is called "functional molecule") 18 is placed in the gap 17, and an insulating layer 13 is formed on the metal nanoparticle, or functional molecule 18, and the electrodes 12. To distinguish the insulating layer 13 from the insulating layer 11B, the insulating layer 11B may be called a first insulating layer, and the insulating layer 13 may be called a second insulating layer. Furthermore, as shown in FIGS. 1 and 2, to apply electric potential to the metal nanoparticle or functional molecule 18, a top gate 19 is formed on the second insulating layer 13, and a side gate (not shown) is formed on the same plane as the one electrode 12A and the other electrode 12B. As a result, tunnel junctions are formed between the metal nanoparticle 18 and the electrodes 12, allowing the electric potential of the metal nanoparticle to be adjusted by the top gate 19 and the side gate. A single electron device can thus be formed. Furthermore, by using fullerene as the functional molecule 18 for example, a molecular device is formed. Nano devices using nanogap electrodes can thus be provided.

In this case, the second insulating layer 13 is not formed in the area from the position where the gap 17 is the smallest to the substrate 11, forming space 13A among the one electrode 12A, the other electrode 12B, the first insulating layer 11B, and the second insulating layer 13. Comparison with a conventional case where the tip surface of the first insulating layer 11B and that of the electrode 12 facing each other are orthogonal to the substrate 11, and the bottom edge of the tip surface contacts the substrate 11 is summarized as follows. With any of the electrode pairs in the first and the second embodiments of the present invention or conventional electrode pairs, when a voltage is applied between the nanogap electrodes, the electric field intensity is the maximum between the nanogap. Consequently, the voltage applied between the electrodes 12A, 12B is efficiently applied to the metal nanoparticle 18 or functional molecule 18. With the electrode pair in this embodiment, the maximum electric field intensity of the first insulating layer 11B is lower than that of a conventional electrode pair because of the existence of the space 13A. With a device using nanogap electrodes, a voltage is applied to the gap in order to work the memory function or switching function of the device. At that time, electric field is also applied to the first insulating layer 11B. The smaller the electric field intensity, the better from the viewpoint of decrease in leakage current, hence prevention of dielectric breakdown. In the first and the second embodiments of the present invention, the existence of the space 13A makes leakage current decreased, further it achieves nanogap electrodes having high dielectric strength. Furthermore, with the cross-sectional structure of the electrode pair according to the first and the second embodiments of the present invention, the cross-sectional area of the proximity portion 16 is isotropically small in three dimensions, and has an arbitrary dimension. Consequently, the number of functional materials such as nanoparticle and molecule to be introduced between the nanogap electrodes can be controlled. With a device having such a cross-sectional structure, the capacitance between a top gate 19, or side gate (not shown), and the functional material can be adjusted, thereby achieving various memory functions or logical functions.

Figure 4:
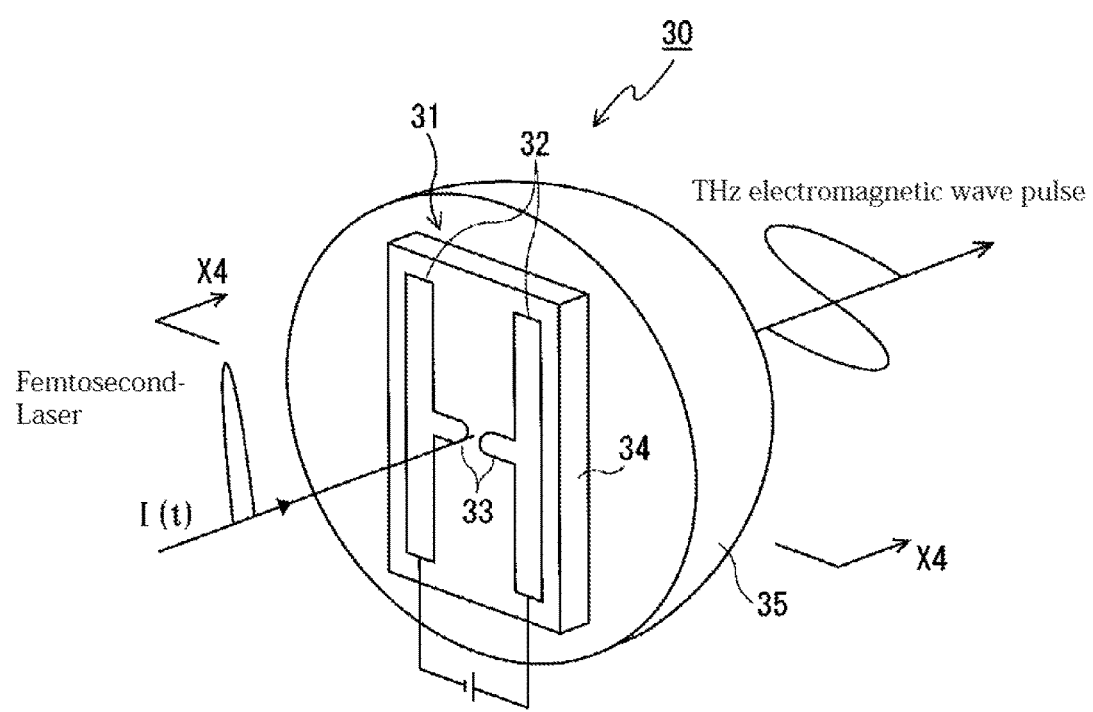
FIG. 4 is a schematic diagram of a device according to an embodiment of the present invention.

FIG. 4 is a schematic diagram of a device according to an embodiment of the present invention. As shown in FIG. 4, the device according to the embodiment of the present invention is a photoconductive antenna element 31 constituting a system 30 that generates THz electromagnetic waves. The photoconductive antenna element 31 is constructed by connecting an antenna 33 to a coplanar transmission line 32 for example, with a small gap formed at the center of the antenna 33. The dimension of this gap is generally set to be on the order of μm to several nanometers. An appropriate DC bias voltage is applied to the gap.

As THz electromagnetic wave generators and detectors, antennas of butterfly type, parallel line type, bow-tie type, logarithmic spiral type, finger gap type, array type, etc. are used. FIG. 4 shows a case where the antenna 33 is of dipole type. By producing optical carriers in a semiconductor using femtosecond pulse laser beam and by modulating sub-picosecond photoconductive current, THz electromagnetic waves can be generated.

In the example shown, a photoconductive antenna element 31 is formed on a GaAs substrate 34, and the photoconductive antenna element 31 is formed on a plane of a semiconductor hemispherical lens 35. By irradiating a femtosecond laser beam to the gap of the antenna 33, free electrons are generated as carriers in a region to which optical pulses in the substrate 34 are irradiated, namely near the positive electrode of the antenna 33. Generated free electrons are drawn to the positive electrode by DC bias electric field, generating instantaneous carrying current, which is a terahertz electromagnetic wave radiation source. Photoconductive current is thus fed, generating THz electromagnetic wave pulses.

Figure 5:
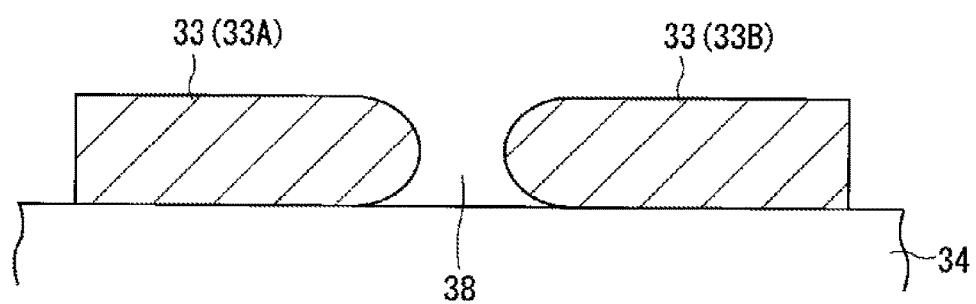
FIG. 5 is a schematic cross-sectional diagram of the antenna in FIG. 4 taken along line X4-X4.

The magnitude of photocurrent during photoirradiation is proportional to the bias electric field derived from bias voltage. When the gap length of the antenna is made to be smaller, the bias electric field becomes larger in proportion to the inverse of the gap length. FIG. 5 is a schematic cross-sectional diagram of the antenna in FIG. 4 taken along line X4-X4. In the embodiment of the present invention, a space 38 is formed among one electrode 33A, the other electrode 33B, and substrate 34, as in the case of the nano-devices shown in FIGS. 1 and 2. By allowing electrodes 33 to form a cross-sectional area orthogonal to the substrate 34 having a certain dimension, the tip of the electrode 33 does not come off the substrate 34. Consequently, the maximum intensity of the electric field generated to the substrate 34 in the embodiment of the present invention is larger than a conventional case where a space 38 such as the one in the embodiment of the present invention is not formed. In other words, since the one electrode 33A and the other electrode 33B have an eaves structure, the effect of inducing electric charge to the semiconductor existing in the substrate 34 becomes larger, and the maximum electric field intensity in a direction of extension of the electrodes on the surface of the substrate 34 immediately under the gap becomes larger, compared to the conventional type not having an eaves structure. As a result, in the embodiment of the present invention, the eaves structure produced by electroless plating helps to produce high electric field in the semiconductor substrate 34, unlike the structure using a part where a substrate contacts electrodes. Consequently, terahertz electromagnetic wave generating efficiency increases.

FIG. 4 shows a system as a generator. With a system as a detector also, it is only necessary to place a current detector instead of DC bias. Since electric field is produced easily, the performance as a detector, namely detection efficiency, increases.

Devices using an electrode pair 50 according to a third embodiment include a capacitor in which a gap is made smaller and opposed areas are made larger. Since such a capacitor has a large capacitance, resonance frequency of an LC resonator having such an electrode pair 50 as a capacitor can be decreased.

[Method for Fabrication]

A method for fabricating nanogap electrodes according to each embodiment of the present invention will hereinafter be described, taking the nanogap electrodes shown in FIG. 2 as an example.

First step: to form a first insulating layer 11B on a semiconductor substrate 11A Second step: to form adhesive layers 14A, 14B on the first insulating layer 11B Third step: to form an electrode pair by the electroless plating method, and make gap length narrowed down to a specified value as required by the molecular ruler electroless plating method.

Specifically, in the second step, adhesive layers 14A, 14B are formed on the first insulating layer 11B so as to have a gap larger than the final gap length for example. Then seed electrode layers 12E, 12F are formed on the adhesive layers 14A, 14B at an interval so as to form a pair. A substrate on which a pair of seed electrodes is formed with at the interval so as to have an initial gap is thus prepared as a sample.

Then in the third step, an electrode pair is formed by the electroless plating method. At that time, the sample is immersed in an electroless plating solution. The immersing time is set depending on the concentration of metal ions contained in the plating solution. When a specified period of time has elapsed since the sample is immersed in the plating solution, the plating solution is changed. A flat surface can thus be formed. The flat surface is not necessarily a plane, but portions having steps may contain smooth curved surfaces. The flat plane here means that the height, or depth, of projections and depressions with respect to the reference surface falls within a range from 5 nm to 30 nm.

In the third step, the number of times of changing the plating solution is decreased to shorten the total time of immersion, and an electrode pair such as the one in the second embodiment can thus be fabricated. Meanwhile, the number of times of changing the plating solution is increased to increase the total time of immersion, and an electrode pair such as the one shown in the third embodiment can thus be fabricated.

The third step will be described further in detail. Metal is deposited on the seed electrode layers 12E, 12F by the iodine electroless plating method to form a part of metal layers 12C, 12D. Then by depositing a metal by the molecular ruler electroless plating method as required, the remaining part of the metal layers 12C, 12D is formed. At that time, it is not essential to adopt the molecular ruler electroless plating method, but the whole of the metal layers may be formed by adopting the iodine electroless plating method only. In the iodine electroless plating method and the molecular ruler electroless plating method, plating progresses under the conditions where plating and etching can occur simultaneously. If plating only occurs on a priority basis, the potential gradient of plating bath of sharply protruding part becomes steeper than that of flat part. Consequently, plating progresses on a priority basis, and thus the surface easily becomes rough. Meanwhile, in the iodine electroless plating method and the molecular ruler electroless plating method, etching is given priority in an area surrounding the sharply protruding part where plating has progressed on a priority basis. As a result, etching occurs, causing protruding part to be eliminated. For this reason, the surface of electrodes fabricated by the both methods becomes smooth and flat, with plating and etching being allowed to progress simultaneously over the whole electrode surface. It is desirable with any of the plating processes to perform processing in several stages to prevent deposited metal from being etched because the conditions in an area close the electrode where plating is occurring change from plating to etching conditions if plating is performed for a long time. Since the surface of the electrodes thus becomes flat, and plating progresses, allowing the radius of curvature of the plated surface to become large, an eaves structure is formed.

In the iodine electroless plating method and the molecular ruler electroless plating method, the sample is immersed in an electroless plating solution. The electroless plating solution of the iodine electroless plating method is prepared by mixing a reducing agent in electrolyte containing metal ions. Meanwhile, the electroless plating solution of the molecular ruler electroless plating method is prepared by mixing a reducing agent and surfactant in electrolyte containing metal ions. When the sample is immersed in the electroless plating solution, the metal ions are reduced by the autocatalytic reaction between the reducing agent and the metal surface, the metal is deposited on the surface of the metal layer, forming metal layers 12C, 12D and thus narrowing the gap between seed electrode layers 12E, 12F. The surfactant contained in the electroless plating solution is chemically adsorbed to the metal layers 12C, 12D formed by the deposition. The surfactant controls the gap length between electrodes to nanometer size. Since metal ions in the electrolyte are reduced by the reducing agent, allowing metal to be deposited, such a method is classified into the electroless plating method. Metal layers 12C, 12D are formed on the seed electrode layers 12E, 12F by plating, and a pair of electrodes 12A, 12B can thus be obtained. The plating temperature of molecular ruler electroless gold plating varies depending on the types of surfactants. For example, in the case of monoalkyl trimethyl ammonium bromide $C_nH_{2n+1}N^+(CH_3)_3Br^-$, the optimum plating temperatures for n=12, 14, 16, and 18 are respectively 60° C., 65° C., 73° C., and 78° C. By adopting the electroless plating method using surfactant molecule, which is a protecting group, on the surface of the electrodes 12A, 12B as a molecular ruler, the molecule of the surfactant controls the gap length, and thus nanogap electrodes can be formed with good reproducibility and accuracy. By then performing UV washing and/or $O_2$ plasma ashing, the molecule having attached to the surface of the electrodes 12A, 12B undergoes ashing, and then carbon is removed.

To construct a device, a metal nanoparticle or functional molecule 18 is then introduced in the nanogap as shown by the dashed line in FIG. 2, and a second insulating layer 13 is formed by the catalytic chemical vapor deposition (CAT-CVD) method, photo CVD method, etc. By performing the above processes, the device shown in FIG. 2 is obtained.

Example

Figure 6:
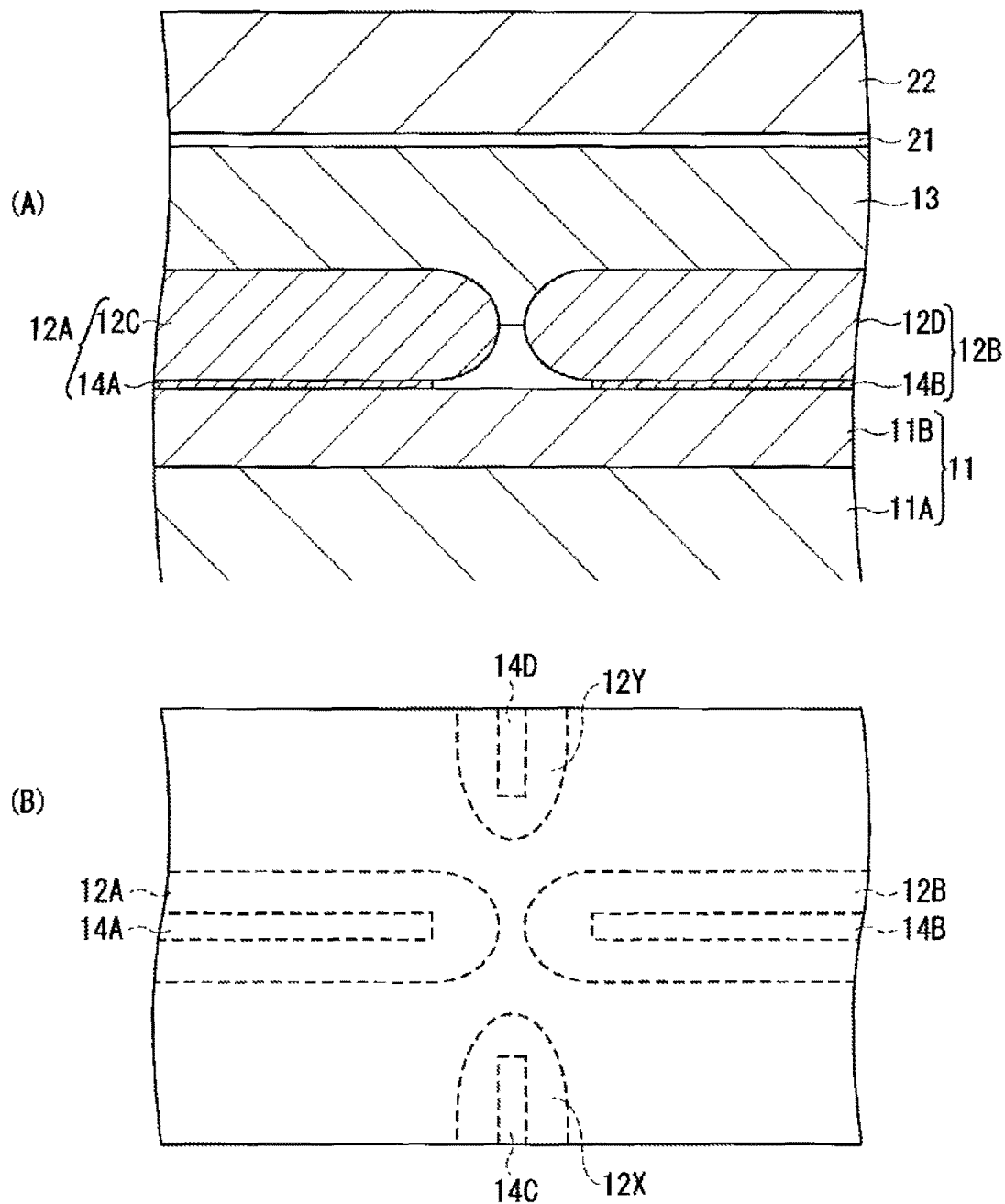
FIG. 6 schematically shows the sample fabricated in the example, where (A) is a cross-sectional view, and (B) is a plan view.

FIG. 6 schematically shows the sample manufactured in the example, where (A) is a cross-sectional view, and (B) is a plan view. To observe the structure of the electrodes, FIG. 6 also shows the state after the sample has undergone processing. The sample shown in FIG. 6 was fabricated by the iodine electroless plating method and molecular ruler electroless plating method by following the procedure shown below.

First, a substrate 11 made by forming a silicon oxide film 11B on a silicon substrate 11A was prepared. A resist was applied to the substrate 11, and by EB lithography technology, a pattern of adhesive layers 14A, 14B having a gap length of 25 nm was drawn. At that time, a pattern of adhesive layers 14C, 14D was drawn on the inside of the region where side gates were to be formed. After development, 2 nm-thick Ti layers were formed as adhesive layers 14A, 14B, 14C, 14D by the EB deposition, and Au was deposited on the adhesive layers 14A, 14B, 14C, 14D in thickness of 10 nm to form a seed electrode layer.

An iodine electroless plating solution was prepared as follows: a thin leaf of gold (36 mg) was immersed in 1.5 mL of iodine solution to allow $[AuI_4]^-$ ions to dissolve using an ultrasonic cleaner. 0.6 g of L(+)-ascorbic acid was added to the solution, putting in hot water at 85 degree C. to reduce the solution into $[AuI_2]^-$ ions. Supernatant was taken out into another vessel, 0.3 g of L(+)-ascorbic acid was added to the solution, putting the vessel in hot water at 85 degree C. to fabricate an undiluted plating solution.

Plating was performed as follows: 8 mL of ultrapure water was measured, to which 8 μL of the undiluted plating solution was added, and the sample was immersed in the plating solution at a room temperature for a desired period of time. The dilution ratio of the undiluted plating solution to ultrapure water was 1:1000. The sample was taken out, subjected to rinsing with the ultrapure water, acetone boiling, and ethanol boiling, and the sample was blown using a nitrogen gun. By repeating this plating process twice, the seed electrode layer was plated using the iodine electroless plating method.

Another electroless plating solution was then prepared. As a molecular ruler, 28 mL of hexamethonium bromide bis (trimethyl ammonium bromide) $C_6H_{12}[N^+(CH_3)_3Br^-]_2$ solution (25 mM) having trimethyl ammonium group on both ends of the alkyl chain was prepared. 120 μL of chlorauric acid $HAuCl_4$ solution (50 mM) was added to the solution. 1 mL or 2 mL of acetic acid (99%) was added to the solution. 3.6 mL of L(+)-ascorbic acid (0.1 M), which was to be used as a reducing agent, was then added, and mixed well to be used as a plating solution. By immersing the sample in this plating solution for 25 minutes at a room temperature twice, metal layers 12C, 12D, 12X, 12Y were prepared. Plating temperature was 25° C.

By the above process, nanogap electrodes were fabricated by the iodine electroless plating method and the molecular ruler electroless plating method.

Oxygen plasma ashing was then performed to remove a part of the molecule having alkyl chain of the surfactant used as the molecular ruler.

Figure 7:
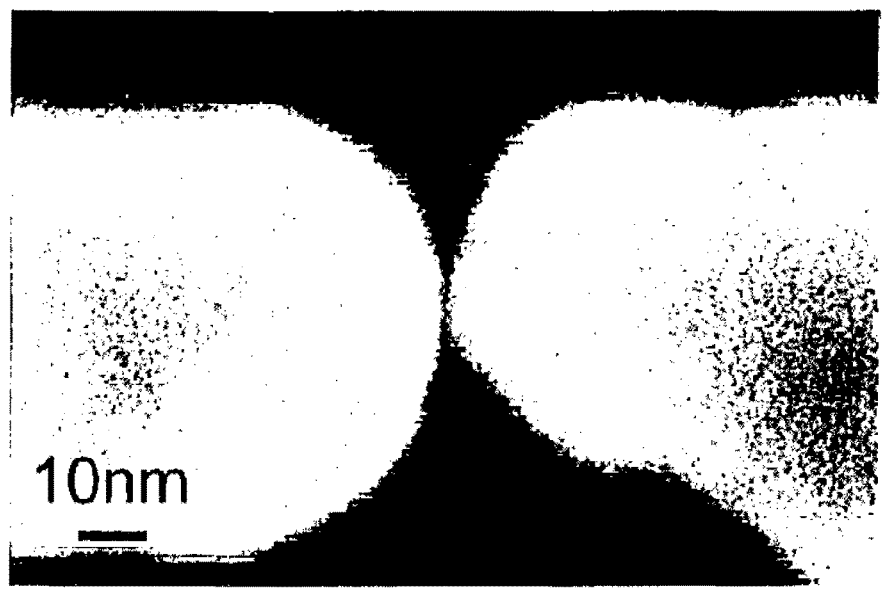
FIG. 7 is an SEM image of the nanogap electrodes fabricated in the example.

FIG. 7 is an SEM image of the nanogap electrodes fabricated in the example. This image exhibits that the gap length between the first and the second electrodes was 1.98 nm, which is supported by the fact that sweeping of voltage between the first and the second electrodes produces current on the order of 0.1 pA or lower. The SEM image viewed from the top reveals that the proximity portion has a curved shape in a plan view. Specifically, it is mostly symmetrical in forward and backward directions with respect to the intermediate plane in the width direction. Also each end of the first and the second electrodes has a mostly semispherical contour in the plan view. The shortest part of the gap formed between the first and the second electrodes was also found to be much shorter than the width of the main body portion.

Then, to observe the cross section of the nanogap electrodes fabricated in the example, the sample was processed as follows. As shown in FIG. 6. SiN was deposited on the nanogap electrodes by 50 nm as an insulating layer 13. To deposit SiN, the sample was placed within a vacuum chamber, silane gas, ammonia gas, and oxygen gas were introduced for the processing by the catalytic CVD method. Then, to cover the nanogap part, platinum and then tungsten W were respectively deposited by 5 to 10 nm and 1 to 2 μm as protective layers 21, 22.

The sample was then processed using focused ion beam (FIB). At that time, a composite ion beam system where an FIB column and an SEM column were placed within the same chamber with a specified angle with respect to the sample was used. By using this system, a large groove was formed in front of the first and the second electrodes in a plan view, and each electrode was gradually cut from the side face.

Figure 8:
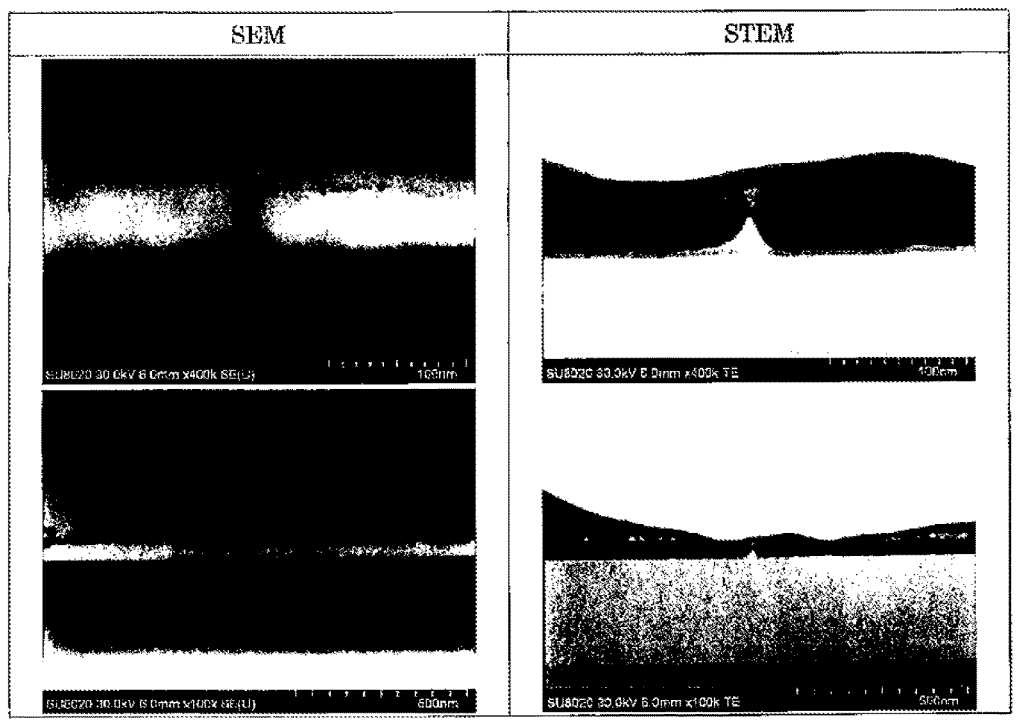
FIG. 8 is a chart showing an SEM and STEM images of the nanogap electrodes obtained after the sample was processed.

FIG. 8 is a chart showing an SEM and STEM images of the nanogap electrodes obtained after the sample was processed. The cross section in FIG. 8 shows that the portions of the nanogap electrodes in proximity to the gap are at a position above the top face of the oxide film, and that the proximity portions are at mostly the center of the cross section. In other words, by comprehensively considering the SEM image in a plan view in FIG. 7 and each image in FIG. 8, it was found that nanogap electrodes 12A, 12B were formed on the insulating layer 11B of the Si substrate 11A, and that the tips of the nanogap electrodes did not contact the insulating layer 11B, and that the proximity portions were curved, with the center of curvature of the cross section of the top and the bottom parts, when the proximity portions were divided into the top and the bottom portions, respectively existing within each of the main body portions.

From the facts of the SEM image in the plan view in FIG. 7 and the cross-sectional SEM and STEM images in FIG. 8, it was found that each cross section of the proximity portions of the nanogap electrodes is smaller than the width and the height of the nanogap electrodes. The dimensions of the cross sectional area of the proximity portions of the nanogap electrodes can be adjusted by adjusting the electroless plating conditions. By adjusting the dimensions of the proximity portions of the nanogap electrodes, the functions to be introduced to the tip portion and surrounding area of the nanogap and the number of nanoparticles to be placed in the nanogap can be controlled. In particular, by ensuring dimensions allowing a plurality of nanoparticles to be introduced, fluctuation in electrical characteristics depending on devices can be suppressed.

Figure 9:
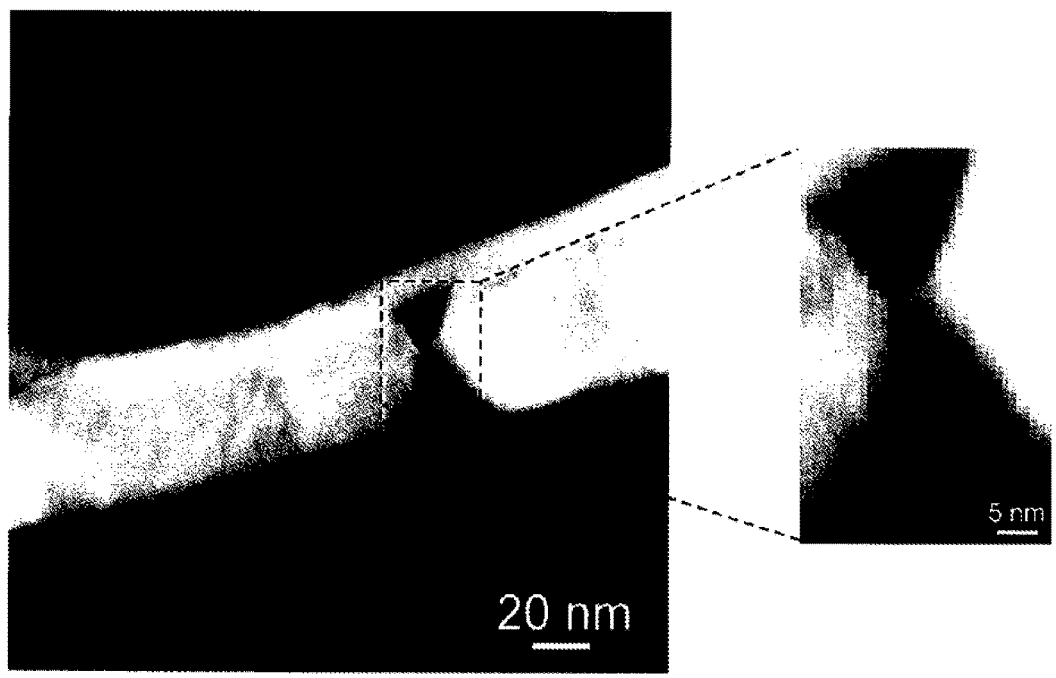
FIG. 9(A) is a chart showing an STEM image of the nanogap electrodes obtained after the sample was processed, and its enlarged view, (B) is a diagram of (A).
Figure 9:
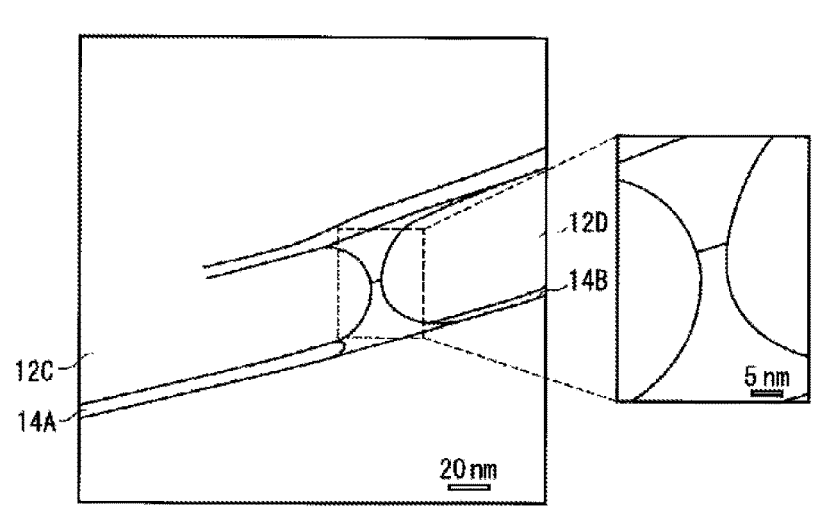

FIG. 9 is a chart showing an STEM image of the nanogap electrodes obtained after the sample was processed, and its enlarged view. At the bottom is shown its image diagram. This image also supports the above description. FIGS. 10(A), (B), and (C) are respectively a spectrum image of electron energy-loss spectroscopy (EELS), image diagram of the peak count of nitrogen (N), and image diagram showing the peak count of silicon (Si). Based on EELS elemental analysis, the white part in the data of light and shade exhibits that the density of that element is high.

Figure 10:
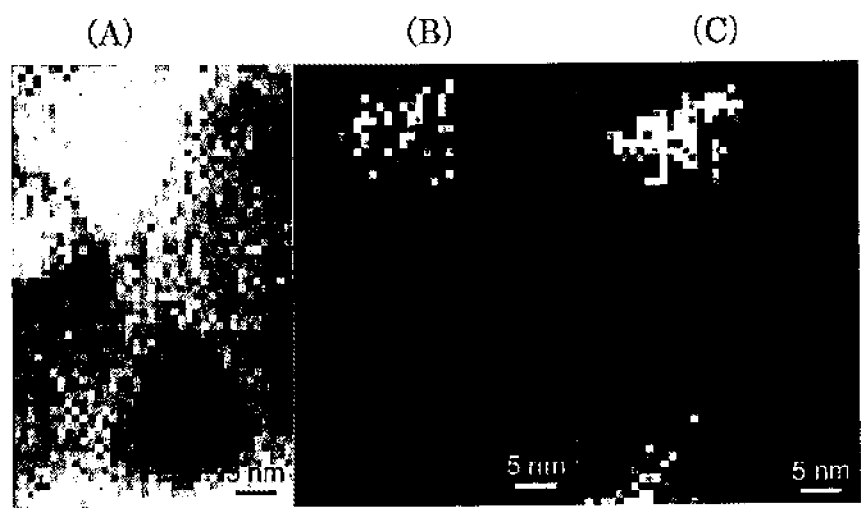
FIGS. 10(A), (B), and (C) are respectively a spectrum image of EELS, image diagram of the peak count of nitrogen (N), and image diagram showing the peak count of silicon (Si).

The result of EELS analysis in FIG. 10 shows that SiN has deposited on the top part of the gap. Meanwhile, Si peak was observed at the bottom of the gap, indicating that that part existed in a state not nitrided.

These results indicate that SiN is not deposited in a region between the proximity portion of the nanogap electrodes and the substrate surface, allowing a space to exist, when SiN was deposited as a passivation film by the CAT-CVD process.

In the above example, the case where the electrode pair was nanogap electrodes was described. However, those having ordinary skill in the technical field of the present invention can of course form a gap on the order of μm to several nanometers by adjusting an electroless plating time.

As a result, by fabricating an electrode pair having a gap on the order of µm as a terahertz photoconductive antenna, the electrode pair constituting the antenna has proximity portions apart from the substrate surface just like an eaves structure. When excitation is performed using a femtosecond laser, etc., electric field can thus be produced easily in an area near the surface of a GaAs substrate, thereby enhancing the efficiency of generation of THz electromagnetic waves, or reversely increasing detection efficiency by using the system as a detector.

Comparative Example

A sample as a comparative example was manufactured as follows.

First, as in the case of the example, a substrate 11 was prepared by forming a silicon oxide film 11B on the entire surface of a silicon substrate 11A. A 2-nm Ti layer was formed as adhesive layers 14A, 14B, 14C, 14D. And then, Au was deposited on the adhesive layers 14A, 14B, 14C 14D by 10 nm to fabricate a seed electrode layer.

Then, when a thin leaf of gold is dissolved in an iodine solution, the ratio of plating solution to pure water was set to 1:100 so that the concentration becomes 10 times higher than that in the example. As a reducing agent, L(+)-ascorbic acid was added to reduce the solution to $[AuI_2]^-$ ions to be used as a plating solution. By immersing the sample in the plating solution twice at a room temperature, the seed electrode layer was plated by the iodine electroless plating method.

Then, another electroless plating solution was prepared. The concentration of chlorauric acid $HAuCl_4$ solution was made to be approximately 10 times higher than that in the example. By immersing the sample in this plating solution for 25 minutes twice at a room temperature, metal layers 12C, 12D, 12X, 12Y were formed.

By performing the above process, nanogap electrodes were fabricated by the iodine electroless plating method and the molecular ruler electroless plating method.

Figure 11:
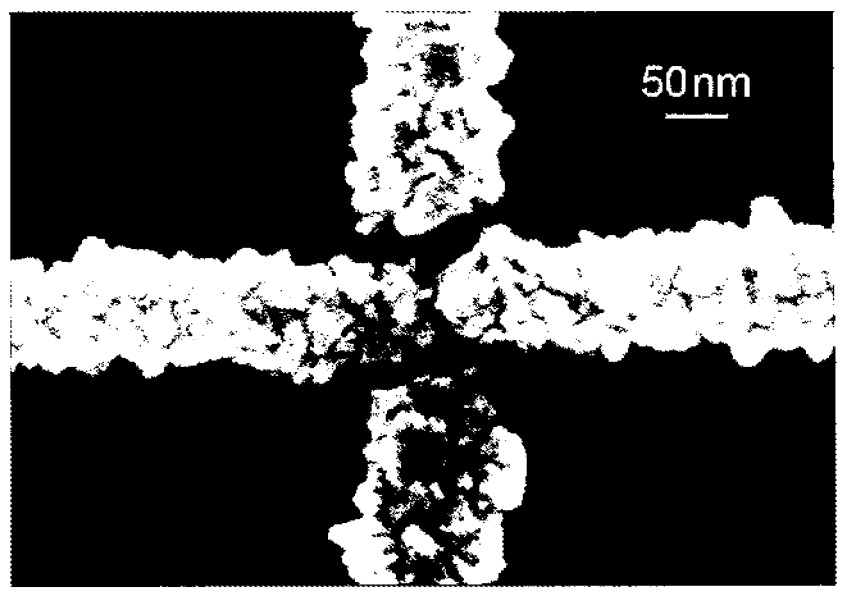
FIG. 11 is an SEM image of the sample fabricated in Comparative Example.

FIG. 11 is an SEM image of the sample fabricated in Comparative Example, where surface roughness is found to be large because the concentration of the plating solution is high. It was thus found that the concentration of the plating solution must fall within a specified range.

By changing the dilution ratio of undiluted plating solution for iodine plating and the concentration of chlorauric acid for molecular ruler electroless plating, it was also found that the following are preferable.

The dilution ratio of undiluted plating solution for iodine plating is preferably 500 to 2000 folds. The concentration of chlorauric acid for molecular ruler electroless plating is preferably 0.1 mM to 0.5 mM.

What is claimed is:

1. A device, comprising:
    a substrate;
    an electrode pair provided on the substrate, the electrode pair consisting of a first electrode and a second electrode; and
    an insulating layer provided to cover the electrode pair,
    wherein each of the first electrode and the second electrode comprises: a main body portion extending in one direction, and a proximity portion extending from the main body portion in a manner where a tip of the first electrode and a tip of the second electrode face each other with a gap therebetween,
    wherein the main body portion contacts the substrate while the proximity portion does not contact the substrate,
    wherein the proximity portion is curved in a manner getting away from the substrate along a direction approaching the tip,
    wherein both of a top portion and a bottom portion of the proximity portion are curved so as to form an arc or an elliptic arc of a cross-sectional shape orthogonal to the substrate containing an axis of extension of the main body portion, and
    wherein an empty space is formed by the first electrode, the second electrode, the substrate, and the insulating layer.

2. The device as set forth in claim 1,
    wherein the electrode pair has nanogap therebetween,
    the first electrode and the second electrode are respectively used as a source electrode and a drain electrode,
    a nanoparticle or a functional molecule is provided in the nanogap, and
    the first electrode and the second electrode, and the nanoparticle or the functional molecule are covered with the insulating layer.

3. A method for fabricating the device of claim 1, comprising:
    preparing a substrate as a sample, the substrate on which a pair of seed electrodes is formed with space, the space being an initial gap;
    immersing the sample in an electroless planting solution;
    exchanging the electroless planting solution after a predetermined time elapses; and
    repeating immersing the sample in the exchanged solution,
    wherein an electrode pair comprises first electrode and second electrode has a nanogap.

4. The method for fabricating the device as set forth in claim 3, wherein a facing area of the electrode pair is adjusted while a gap between the first electrode and the second electrode is kept constant.

5. The device as set forth in claim 1,
    wherein the first electrode and the second electrode comprise: a metal layer; and an adhesive layer provided between the metal layer and the substrate to adhere the metal layer to the substrate, and
    the proximity portion is comprised of the metal layer.

6. The method for fabricating the device as set forth in claim 3, further comprising
    providing a nanoparticle or a functional molecule in the nanogap.

* * * * *